United States Patent [19]

Corwin et al.

[11] 4,199,377

[45] Apr. 22, 1980

[54] SOLAR CELL

[75] Inventors: Rudolph E. Corwin, Seattle; Dietrich E. Riemer, Auburn, both of Wash.

[73] Assignee: The Boeing Company, Seattle, Wash.

[21] Appl. No.: 16,245

[22] Filed: Feb. 28, 1979

[51] Int. Cl.² ............... H01L 31/06; H01L 21/223; H01L 21/76
[52] U.S. Cl. .................. 136/89 SJ; 29/572; 136/89 CC; 148/187; 148/188; 357/30; 357/52
[58] Field of Search ......... 136/89 CC, 89 SJ, 89 SG; 357/30, 52; 29/572; 148/187, 188

[56] References Cited

U.S. PATENT DOCUMENTS

| | | | |
|---|---|---|---|
| 2,993,945 | 7/1961 | Huth | 136/89 |
| 3,113,220 | 12/1963 | Goulding et al. | 307/299 R |
| 3,156,593 | 11/1964 | Ligenza | 148/187 |
| 3,457,467 | 7/1969 | Amsterdam et al. | 357/30 |
| 3,483,039 | 12/1969 | Gault | 136/89 |
| 3,714,474 | 1/1973 | Hoff, Jr. | 310/3 B |

OTHER PUBLICATIONS

W. E. Taylor, "Array Automated Assembly–Phase 2," DOE/JPL 954853-78/1, Spectrolab, Inc. Quarterly Report, Feb. 1978, pp. 2-4, 20-28.
H. M. Demsky et al., "Technique for Counteracting Epitaxial Autodoping," *IBM Tech. Disc Bull.,* vol. 13, pp. 807-808 (1970).

*Primary Examiner*—Aaron Weisstuch
*Attorney, Agent, or Firm*—David G. Pursel; Robert L. Gullette

[57] ABSTRACT

A solar cell including a dielectric isolation member to electrically isolate an active region of the cell from the unfinished edge thereof and to protect the p-n junction from surface contaminants. The isolation member is fabricated on top of a semiconductor wafer before diffusion.

14 Claims, 8 Drawing Figures

U.S. Patent     Apr. 22, 1980     4,199,377
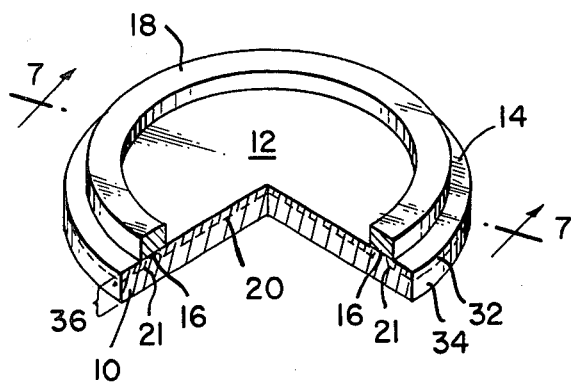
FIG. 1
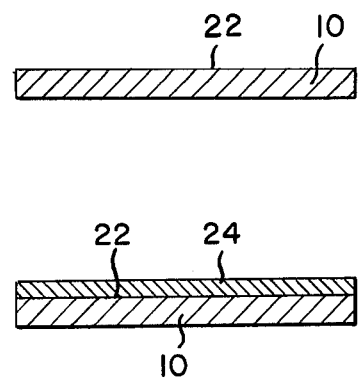
FIG. 2
FIG. 3
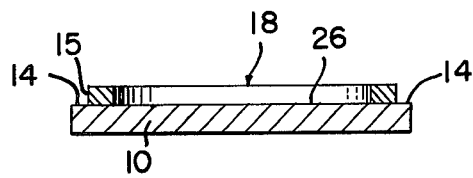
FIG. 4
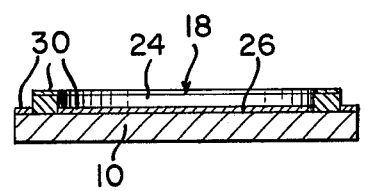
FIG. 5
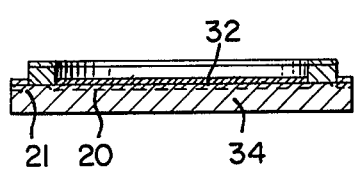
FIG. 6
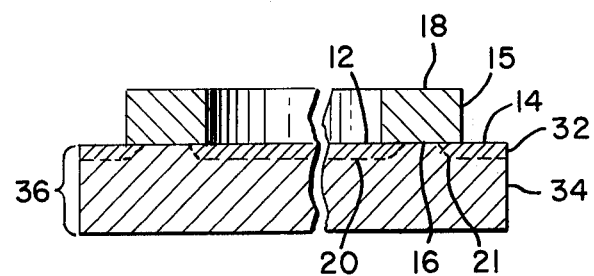
FIG. 7
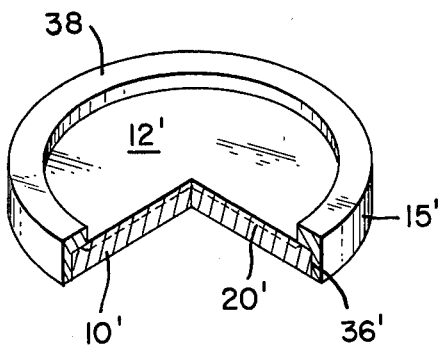
FIG. 8

SOLAR CELL

BACKGROUND OF THE INVENTION

This invention relates to solar cells and the manufacture thereof.

Solar cells are fabricated by a veriety of methods, with the spin-on method being the most commonly used. According to this method, a doped silicon wafer or semiconductor substrate is mounted on a turntable and a liquid impurity, or dopant, is placed on the center of the wafer. The wafer is spun rapidly about its central axis to spread the dopant evenly across the upper surface of the wafer. Some of the dopant usually spills over the edge of the wafer during this fabrication step. After drying, the wafer is baked, causing the dopant to diffuse beneath the surface of the wafer and form a p-n junction. The large surface area on the top of the solar cell beneath which the p-n junction is formed is termed the active region of the cell. It is here that light energy is converted to electrical energy as a result of the photovoltaic effect. Electron-hole pairs are generated in the active region and are drawn out to electrodes on the top and bottom sides of the cell as useful current. The charge generated as these pairs are separated by the p-n junction creates a potential difference between the electrodes on the solar cell. The dopant which spilled over the side of the wafer during the spinning step, however, is the source of short circuit paths on the edge of the wafer connecting one side of the p-n junction to the other. Typically, these conductive paths are removed mechanically or chemically so that the p-n junction which is exposed on the edge surface of the silicon wafer is not short circuited.

Two other methods commonly used in the manufacture of solar cells are the gaseous and planar source method. In the gaseous method, the doped silicon wafer is placed in a furnace and a gas containing the desired impurity is passed over it. The impurity is deposited from the gas onto the surface of the wafer and the heat from the furnace causes the impurity to diffuse beneath the surface of the wafer. In the planar source process, the doped silicon wafer is placed inside a furnace in close proximity with a disc containing the desired impurity. As the temperature is elevated within the furnace, the impurity particles migrate from the impurity source to the wafer and diffuse beneath its surface. During the diffusion step in both the gaseous and planar source methods, the impurity diffuses into the wafer along the peripheral edge as well as the top surface. The spilled dopant which is diffused along the peripheral edge of the wafer is the source of the short circuit paths which cause the p-n junction to be short circuited and the top and bottom surfaces of the wafer to be electrically connected.

The formation of short circuit paths could be eliminated by masking or covering the edges of the wafer during application and diffusion of the impurity or dopant. This is highly undesirable, however, because of the extra time and expense associated with the extra steps required to position protective masks around the edge of the wafer. A typical method for removing the short circuit paths from the peripheral edge of the wafer involves grinding away the side surface of the wafer. Another common method for removing the short circuit paths involves etching them away along with part of the side surface of the wafer.

Both of these methods for removing the short circuit paths are unsatisfactory because, after the short circuit paths have been removed by etching or grinding, the p-n junction along the edge of the wafer is left exposed to the environment. Semiconductor devices are very sensitive to surface contaminants since leakage paths form readily where dust particles or other contaminants settle onto the exposed p-n junction. If either edge grinding or etching is employed to remove the short circuit paths from the edge of the wafer, therefore, it is preferable that the edge surface be sealed afterwards to protect the exposed p-n junction from the effects of surface contaminants with attendant uneconomical increase in cost and fabrication time.

Accordingly, it is an object of this invention to provide a solar cell which has an isolation member suitable for isolating the active region from short circuit paths along the peripheral edge of the cell.

Another object of this invention is to provide a solar cell having the intersection of the p-n junction and the surface of the cell sealed beneath the isolation member.

A further object of this invention is to provide a method for manufacturing solar cells whereby short circuit paths need not be removed mechanically or chemically from the unfinished edge of the cell.

SUMMARY OF THE INVENTION

This invention accomplishes these and other objects by providing a solar cell having an isolation member which is suitable for electrically isolating the active region of the solar cell from the defects along the peripheral unfinished edge of the wafer. Furthermore, the isolation member overlaps the exposed p-n junction and seals it at the surface of the wafer. The isolation member is made of dielectric material, doped with the same impurity type as is the doped silicon wafer, and is deposited on the upper surface of the wafer. A p-n junction is formed beneath the surface of the wafer by diffusing an impurity, opposite in polarity from the doped silicon wafer, a predetermined distance beneath the upper surface of the wafer. The presence of the isolation member prevents the formation of the p-n junction beneath the isolation member except for a small region which results from some lateral diffusion beneath the isolation member. The p-n junction that is exposed at the surface of the wafer is therefore sealed beneath the isolation member and thus protected from the presence of surface contaminants. The active region enclosed by the isolation member is electrically isolated from the peripheral unfinished edge of the wafer by an intermediate region of the wafer lying beneath the isolation member which separates the active region from the unfinished edge of the wafer. The presence of the dopant impurity in the dielectric isolation member insures that the conductivity type of the wafer continues to exist in the intermediate region beneath the isolation member.

It will be appreciated from the foregoing brief summary that the isolation member may be disposed in any desired location on the upper surface of the doped silicon wafer so long as it encloses a portion of the solar cell, isolating said portion from the defective edge region. The isolation member may even be disposed in such a manner that it covers the outer peripheral unfinished edge of the wafer. This method of electrically isolating the active region of the solar cell from defective edge areas eliminates the need for mechanical or chemical removal of the edge areas. It further eliminates the extra step of sealing the p-n junction to protect the junction from dust particles or other contaminants.

These and other features, objects and advantages of this invention will become more readily appreciated when taken in conjunction with the accompanying drawings, wherein like reference numerals indicate like parts throughout the several views.

BRIEF DESCRIPTION OF THE DRAWINGS

FIG. 1 is a cut-away perspective view of a solar cell with the isolation member disposed on the upper surface;

FIGS. 2 to 6 are cross-sectional views, on enlarged scale, depicting fabrication of the FIG. 1 cell;

FIG. 7 is a section taken along line 7—7 in FIG. 1 in enlarged scale;

FIG. 8 is generally similar to FIG. 1, depicting a second preferred embodiment of the solar cell of this invention.

DETAILED DESCRIPTION OF THE DRAWINGS

The solar cell of this invention is shown generally in FIG. 1. The solar cell is fabricated from wafer 10 of semiconductor material consisting essentially, for example, of silicon. Wafer 10 contains an impurity concentration of one conductivity type, for example, p type conductivity. The solar cell of FIG. 1 has its top surface divided into three regions. The exposed central portion or active region 2 is separated from the outer wafer surface 14 by intermediate region 16. Isolation member 18 encloses active region 12 and overlaps intermediate region 16. P-n junctions 20 and 21 lie beneath the top surface of wafer 10 and are formed by diffusing an impurity of conductivity type opposite that of wafer 10 into wafer 10.

FIGS. 2–6 illustrate one sequence of steps for manufacturing the solar cell of the invention, although it will be apparent to one skilled in the art that many other procedures could be used. Referring to FIG. 2, fabrication of the solar cell begins with wafer 10 of semiconductor material, such as silicon. The semiconductor wafer is heavily doped with an impurity of one conductivity type, for example, p type conductivity. Typically, a p type wafer has an impurity concentration of about $10^{17}$ impurity atoms per cubic centimeter. Wafer 10 has at least one major surface, here, top surface 22, prepared to be flat and smooth. Wafer 10 is placed in an oxidizing atmosphere at high temperature along with a source of impurity of the same conductivity type as wafer 10. As is shown in FIG. 3, doped dielectric 24 is grown on surface 22 when the wafer is exposed to this environment. Doped dielectric 24 is a glass-like material with the same conductivity type impurity as wafer 10, i.e., a p type impurity in this example.

Referring to FIG. 4, isolation member 18 is formed by selectively removing an interior portion of doped dielectric material 24 to expose central portion 26 of the wafer. In the example illustrated, dielectric material is also removed to expose outer wafer surface 14 and outer peripheral surface 15 of isolation member 18.

An alternate method for forming isolation member 18 on wafer 10 involves using a conventional thick film process. In this method, glass is ground and formed into a paste. An impurity of the same type and concentration as that contained in the wafer is added to the paste. Isolation member 18 is formed by printing the paste onto surface 22 of the wafer through a stencil that has an annular perforation. The wafer is placed in a furnace and the isolation member is fused to surface 22 of the wafer.

Referring to FIG. 5, dopant 30 is applied to surfaces 12 and 14 by any of several techniques, one of which is the spin-on method. Dopant 30 contains an impurity of conductivity type opposite to that of the doped silicon wafer, that is, an n type impurity in this example. After the dopant is applied, the wafer is returned to the furnace where the n type impurity is diffused into the exposed surfaces. Typically, the n type impurity is diffused into the surface of the wafer to provide a surface resistivity of 25 to 75 hms per square, which is equivalent to about $10^{20}$ to $10^{21}$ impurity atoms per cubic centimeter. As is best shown in FIG. 6, p-n junctions 20 and 21 are formed beneath the surface of the wafer at the point where n diffused region 32 meets p region 34. The shallow p-n junction lies about 0.2 to 0.5 microns beneath surface 22 of the wafer. Removal of dopant 30 from the exposed surfaces is the final step in the fabrication process.

As is shown in FIG. 1, p-n junction 21 is exposed along the unfinished edge 36 of the wafer. Isolation member 18 is not employed in conventional solar cell fabrication and p-n junctions 20 and 21 are joined. When the dopant is applied during a conventional fabrication process, it typically spills over the unfinished edge causing electrical paths to be formed along the unfinished edge 36 which electrically join the n and p regions, 32 and 34, of the wafer. These short circuit paths will render the finished solar cell inoperative unless they are removed. Typically, they are removed from the unfinished edge by mechanically grinding or chemically etching the edge of the wafer. After the edge of the wafer has been ground or etched in the conventional fabrication process, the p-n junction is still exposed to the environment along the edge of the wafer. Leakage paths readily form where dust particles and other contaminants settle upon the exposed p-n junction. Therefore, when using the conventional fabrication process, it is desirable to perform yet a further step and seal the exposed p-n junction to protect it from the presence of surface contaminants.

This invention eliminates the problems associated with conventional solar cell fabrication mentioned above. Referring to FIG. 7, shallow diffused p-n junction 20 is shown within active region 12 and p-n junction 21 is shown associated with unfinished edge 36. Intermediate region 16 is composed entirely of doped silicon wafer material and does not contain a p-n junction. P-n junctions 20 and 21 extend laterally beneath isolation member 18 because of the slight lateral diffusion of the n impurity beneath the doped isolation member during the diffusion process. Intermediate region 16 electrically isolates active region 12 from outer wafer surface 14. Therefore, any short circuit paths affecting p-n junction 21 will have no electrical effect upon active region 12.

During the diffusion process, the n impurity diffuses laterally beneath isolation member 18. The resulting p-n junction 20 is sealed beneath isolation member 18 as shown in FIG. 7. Accordingly, the typical manufacturing step consisting of sealing the exposed p-n junction is eliminated.

A second preferred embodiment of the solar cell of this invention is illustrated in FIG. 8 wherein elements corresponding to those already illustrated and described with respect to the FIG. 1 solar cell are referenced with the same reference numerals, primed, and accordingly these elements are not described further hereinafter. The FIG. 8 solar cell is generally similar to the FIG. 1 solar cell except that outer exposed peripheral surface 15' of isolation member 38 actually covers peripheral unfinished edge 36' of wafer 10'. P-n junction 20' is sealed beneath isolation member 38. No short circuit paths can form along edge 36' because isolation member 38 overlaps and protects edge 36' from dopant during the application and diffusion steps.

The example described above relates to a solar cell which is obtained by means of a doped silicon wafer of p type conductivity, but, according to the invention, solar cells can also be obtained using a wafer doped with an n type conductivity. In this latter case, i.e., with n type wafer, all the conductivity types mentioned above would be reversed. It is further to be noted that dimensions of the drawings are illustrative and symbolic of the invention, and there is no intention to indicate scale or relative proportion of the elements shown therein.

Although two preferred embodiments have been illustrated and described herein, variations will become apparent to one skilled in the art. For example, the isolation member could be positioned in a variety of ways upon the wafer. The outer peripheral surface 15 of the isolation member could be substantially evenly spaced from the peripheral edge of the wafer, or it could be contiguous with the edge of the wafer. Accordingly, the invention is not to be limited to the specific embodiments illustrated and described herein, and the true scope and spirit of the invention are to be determined by reference to the appended claims.

What is claimed is:

1. A method of manufacturing solar cells, comprising the steps of:
   a. providing a wafer of semiconductor material with a peripheral unfinished edge and doped with an impurity of a first conductivity type;
   b. depositing a dielectric material doped with an impurity of said first conductivity type on a major surface of said wafer;
   c. forming an isolation member by removing an interior portion of said dielectric material so as to expose a portion of said major surface; and
   d. forming an active region by diffusing an impurity opposite in polarity from said first conductivity type a predetermined distance beneath said exposed portion of said major surface so as to form a p-n junction which intersects said major surface beneath said isolation member such that said p-n junction is sealed beneath said isolation member without finishing said peripheral unfinished edge 2. The method of claim 1, wherein said isolation member is positioned on said major surface of said wafer such that an outer exposed peripheral surface of said isolation member is substantially evenly spaced from said peripheral unfinished edge of said wafer.

3. The method of claim 1 wherein said isolation member is positioned on said major surface of said wafer such that an outer exposed peripheral surface of said isolation member is contiguous with said peripheral unfinished edge of said wafer.

4. The method of claim 1 wherein said isolation member is positioned on said major surface of said wafer such that an outer exposed surface of said isolation member is covering said peripheral unfinished edge of said wafer.

5. A method of manufacturing solar cells, comprising the steps of:
   a. providing a wafer of semiconductor material with a peripheral unfinished edge and doped with an impurity of a first conductivity type;
   b. forming an isolation member by depositing a dielectric material doped with an impurity of said first conductivity type on a portion of a major surface of said wafer, said isolation member enclosing an exposed portion of said major surface;
   c. heating said wafer in a furnace causing said isolation member to fuse to said major surface of said wafer;
   d. forming an active region by diffusing an impurity opposite in polarity from said first conductivity type a predetermined distance beneath said exposed portion of said major surface so as to form a p-n junction which intersects said major surface beneath said isolation member such that said p-n junction is sealed beneath said isolation member without finishing said peripheral unfinished edge.

6. The method of claim 5, wherein said isolation member is positioned on said major surface of said wafer such that an outer exposed peripheral surface of said isolation member is substantially evenly spaced from said peripheral unfinished edge of said wafer.

7. The method of claim 5 wherein said isolation member is positioned on said major surface of said wafer such that an outer exposed peripheral surface of said isolation member is contiguous with said peripheral unfinished edge of said wafer.

8. The method of claim 5 wherein said isolation member is positioned on said major surface of said wafer such that an outer exposed surface of said isolation member is covering said peripheral unfinished edge of said wafer.

9. A solar cell, comprising:
   a wafer of semiconductor material with a peripheral unfinished edge and doped with an impurity of a first conductivity type; a major surface of said wafer having an outer region associated with said peripheral unfinished edge and an inner active region, both said regions being of a conductivity type opposite from said first conductivity type thereby forming p-n junctions within said wafer, and an intermediate lengthwise area of said wafer, closing upon itself and surrounding said active region, interadjacent said active region and said outer region; and an isolation member of dielectric material doped with an impurity of said first conductivity type, joined upon said major surface in an overlying relationship with said intermediate area, such that said active region is electrically isolated from said peripheral unfinished edge without finishing said peripheral unfinished edge.

10. The solar cell as defined in claim 9 having said isolation member positioned on said major surface of said wafer such that an outer exposed peripheral surface of said isolation member is substantially evenly spaced from said peripheral unfinished edge of said wafer.

11. The product produced by the process which comprises the steps of:
   a. providing a wafer of semiconductor material with a peripheral unfinished edge and doped with an impurity of a first conductivity type;
   b. depositing a dielectric material doped with an impurity of said first conductivity type on a major surface of said wafer;

c. forming an isolation member by removing a central portion of said doped dielectric material thereby exposing a portion of said major surface of said wafer; and d. forming an active region by diffusing an impurity opposite in polarity from said first conductivity type a predetermined distance beneath said exposed portion of said major surface so as to form a p-n junction which intersects said major surface beneath said isolation member such that said p-n junction is sealed beneath said isolation member without finishing said peripheral unfinished edge.

12. The product produced by the process which comprises the steps of:

a. providing a wafer of semiconductor material with a peripheral unfinished edge and doped with an impurity of a first conductivity type;

b. forming an isolation member by depositing a dielectric material doped with an impurity of said first conductivity type on a major surface of said wafer, said isolation member enclosing an exposed portion of said major surface;

c. heating said wafer in a furnace thereby causing said isolation member to fuse to said wafer;

d. forming an active region by diffusing an impurity opposite in polarity from said first conductivity type a predetermined distance beneath said exposed portion of said major surface so as to form a p-n junction which intersects said major surface beneath said isolation member such that said p-n junction is sealed beneath said isolation member without finishing said peripheral unfinished edge.

13. A solar cell comprising:
a wafer of semiconductor material with a peripheral unfinished edge and doped with an impurity of a first conductivity type; a major surface of said wafer having an outer region of said first conductivity type associated with said peripheral unfinished edge and an inner active region of a conductivity type opposite from said first conductivity type; and an isolation member of dielectric material doped with an impurity of said first conductivity type, joined upon said major surface such that an outer exposed peripheral surface of said isolation member is contiguous with said peripheral unfinished edge of said wafer, whereby said active region is electrically isolated from said peripheral unfinished edge.

14. A solar cell comprising:
a wafer of semiconductor material with a peripheral unfinished edge and doped with an impurity of a first conductivity type; a major surface of said wafer having an outer region of said first conductivity type associated with said peripheral unfinished edge and an inner active region of a conductivity type opposite from said first conductivity type; and an isolation member of dielectric material doped with an impurity of said first conductivity type, joined upon said major surface such that an outer exposed surface of said isolation member is covering said peripheral unfinished edge of said wafer, whereby said active region is electrically isolated from said peripheral unfinished edge.

* * * * *